United States Patent
Khan. P et al.

(10) Patent No.: US 10,949,375 B2
(45) Date of Patent: Mar. 16, 2021

(54) METHODS AND APPARATUS FOR AN INTERFACE

(71) Applicant: SEMICONDUCTOR COMPONENTS INDUSTRIES, LLC, Phoenix, AZ (US)

(72) Inventors: Athar Ali Khan. P, Kanaka Nagar (IN); Namrata Maniram Pandey, Mumbai (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/661,147

(22) Filed: Oct. 23, 2019

(65) Prior Publication Data

US 2021/0034563 A1    Feb. 4, 2021

Related U.S. Application Data

(60) Provisional application No. 62/882,136, filed on Aug. 2, 2019.

(51) Int. Cl.
*H03K 5/24* (2006.01)
*G06F 13/40* (2006.01)

(52) U.S. Cl.
CPC .......... *G06F 13/4081* (2013.01); *H03K 5/24* (2013.01)

(58) Field of Classification Search
CPC ................ G06F 13/4081; H03K 5/24
See application file for complete search history.

(56) References Cited

U.S. PATENT DOCUMENTS

| | | | |
|---|---|---|---|
| 2002/0118501 A1* | 8/2002 | Ochi | H02H 9/004 361/93.9 |
| 2005/0060490 A1* | 3/2005 | Lu | G06F 13/4081 711/115 |
| 2007/0283071 A1* | 12/2007 | Konishi | G06F 13/4081 710/302 |
| 2009/0077270 A1* | 3/2009 | Chen | G05B 19/0428 710/2 |
| 2010/0105319 A1* | 4/2010 | Yeung | H04L 25/03878 455/18 |
| 2011/0167178 A1 | 7/2011 | Mogilnitsky | |
| 2014/0118002 A1* | 5/2014 | Kim | G01R 31/54 324/538 |

FOREIGN PATENT DOCUMENTS

CN    2011104515126 A    7/2013

* cited by examiner

*Primary Examiner* — Tim T Vo
*Assistant Examiner* — Harry Z Wang
(74) *Attorney, Agent, or Firm* — The Noblitt Group, PLLC; Hettie L. Haines

(57) ABSTRACT

Various embodiments of the present technology may provide methods and apparatus for an interface. The interface may be configured to detect a hot unplug condition based on a first output voltage at an output terminal of a first buffer circuit and a second output voltage at an output terminal of a second buffer circuit, wherein the first and second buffer circuits receive a common input. The interface may further detect the hot unplug condition based on a difference of a peak magnitude of the first output voltage and a peak magnitude of the second output voltage.

19 Claims, 9 Drawing Sheets

METHODS AND APPARATUS FOR AN INTERFACE

CROSS-REFERENCE TO RELATED APPLICATIONS

This application claims the benefit of U.S. Provisional Patent Application No. 62/882,136, filed on Aug. 2, 2019, the entire contents of which is incorporated herein by reference.

BACKGROUND OF THE TECHNOLOGY

Many electrical systems utilize an interface to receive and/or transmit data between a host device and a sink device. Many interfaces are designed to follow certain protocols to optimize the power in the system. For example, and referring to FIG. 9, optimization may be achieved by incorporating a state machine in the interface. Initially, the interface is in a low power mode. Once the interface detects connection of an external interface, the interface informs the host by making itself visible to the host. During "electrical idle," the interface stays in active mode for "$T_{idle}$" time, which is reset after each "electrical idle" ends. If there is no input from the host during the "$T_{idle}$" time period, then the interface enters a slumber mode (low power mode). In slumber mode, the interface polls for a load approximately every 12 ms. However, the interface isn't designed to perform polling in an active mode to avoid signal integrity issues.

Due to this optimization, the interface may not be able detect a hot unplug condition during the active mode, and therefore, will continue to consume power as the host device sends handshaking signals, which keep the interface in the active, high-power mode. Therefore, it may be desired to detect the hot unplug condition immediately and power-down the interface in response to the detected unplug condition. It may also be desired to detect the hot unplug condition across all operating conditions with varying supply voltages, varying input swings, varying gain, varying operating speeds, and the like.

SUMMARY OF THE INVENTION

Various embodiments of the present technology may provide methods and apparatus for an interface. The interface may be configured to detect a hot unplug condition based on a first output voltage at an output terminal of a first buffer circuit and a second output voltage at an output terminal of a second buffer circuit, wherein the first and second buffer circuits receive a common input. The interface may further detect the hot unplug condition based on a difference of a peak magnitude of the first output voltage and a peak magnitude of the second output voltage.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various signal detectors, redrivers, amplifiers, transistors, resistive elements, switching devices, equalizers, buffers, and the like, which may carry out a variety of functions. In addition, the present technology may be practiced in conjunction with any number of electronic systems, such as automotive, aviation, "smart devices," portables, and consumer electronics, and the systems described are merely exemplary applications for the technology.

Methods and apparatus for an interface according to various aspects of the present technology may operate in conjunction with any suitable communication system. For example, and referring to FIG. 1, an exemplary system 100 may comprise a host device 105 (i.e., a source device), an interface circuit 110, and a sink device 115. According to an exemplary embodiment, the host device 105 and interface circuit 110 may be connected by a transmission line, such as a first transmission line 120 and a second transmission line 125, and a coupling capacitor, such as coupling capacitors C1, C2. Furthermore, the interface circuit 110 and the sink device 115 may be connected by a transmission line, such as a third transmission line 130 and a fourth transmission line 135, and a coupling capacitor, such as coupling capacitors C3, C4. Accordingly, the host device 105 and the sink device 115 are connected to and communicate with each other via the interface circuit 110. The transmission lines 120, 125, 130, 135 may comprise any suitable communication lines, buses, links, wires, cables, and the like for transferring data.

Figure 1:
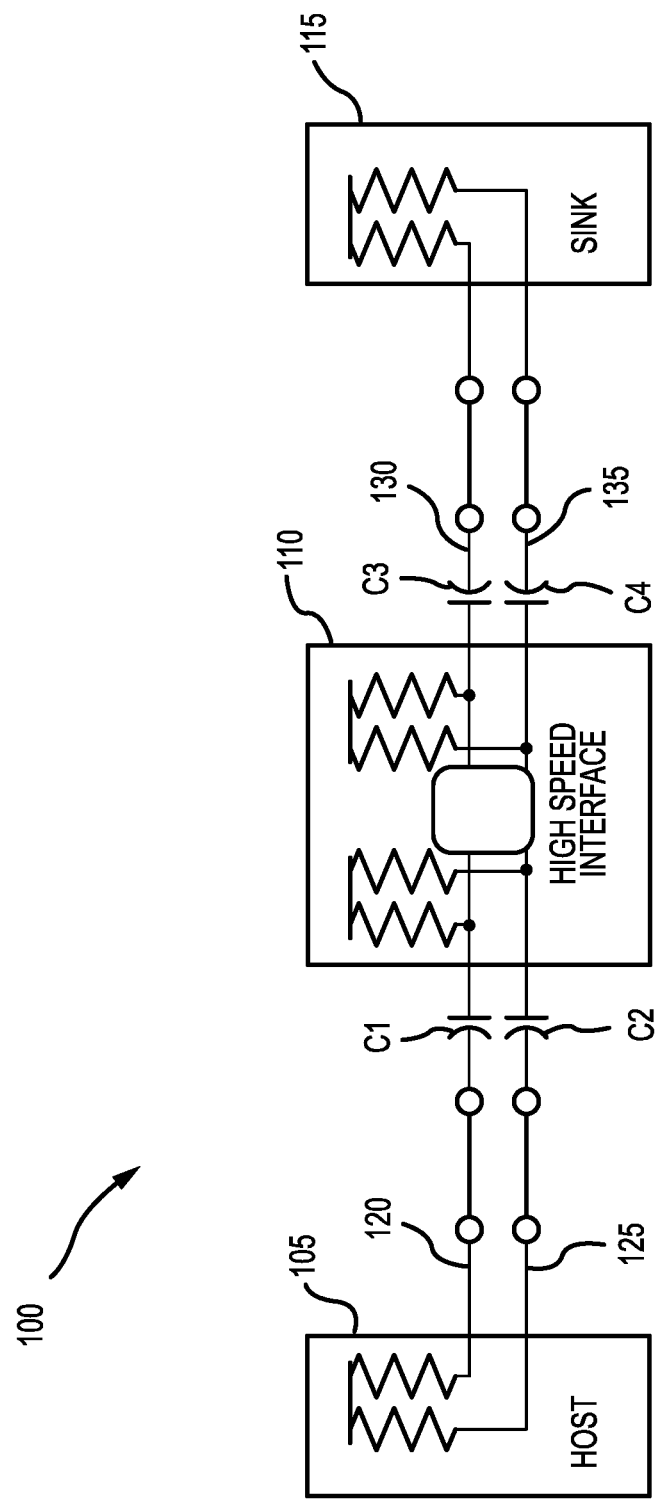
FIG. 1 is a block diagram of a system in accordance with an exemplary embodiment of the present technology.
Figure 2:
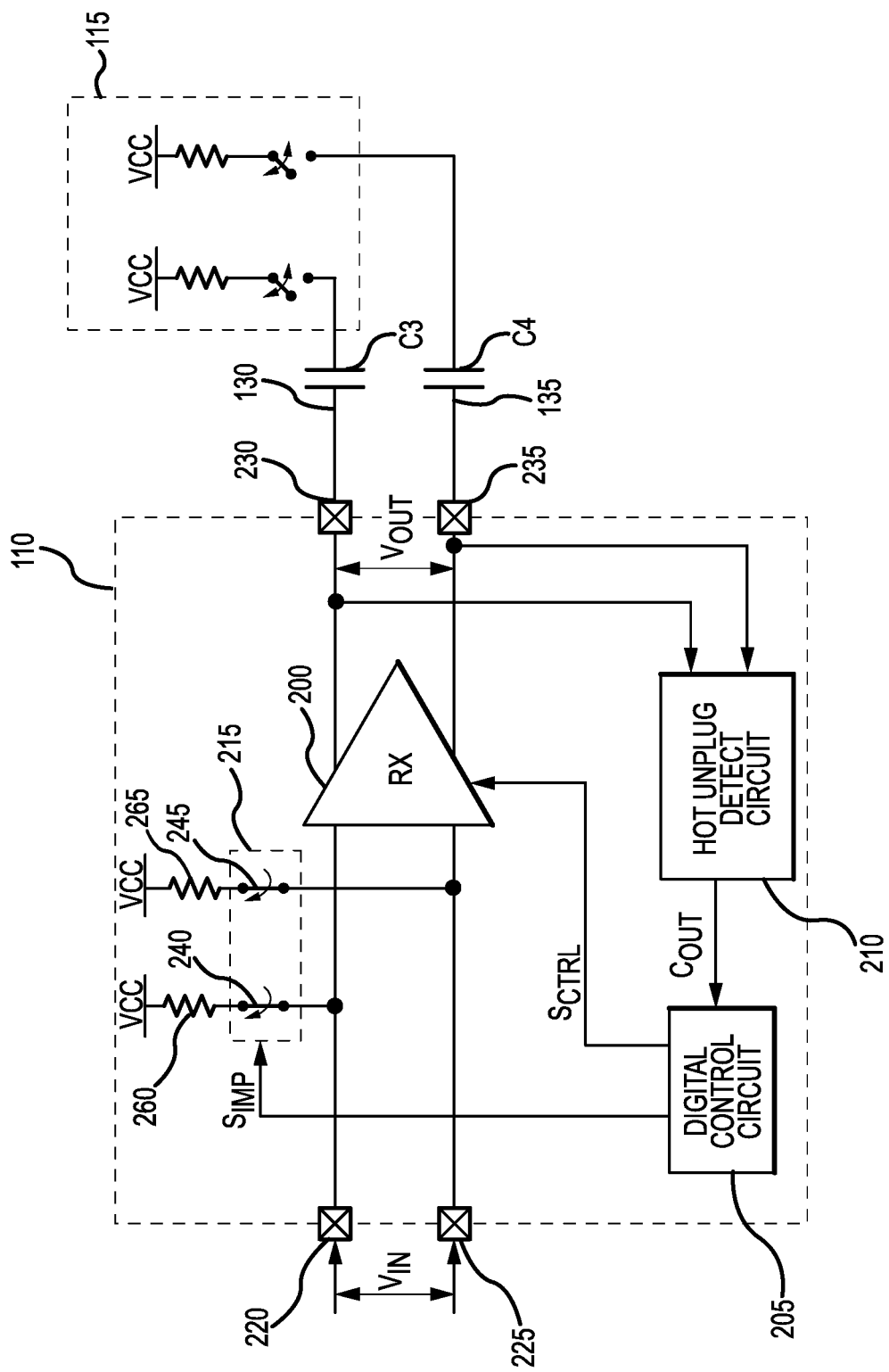
FIG. 2 is a block diagram of an interface in accordance with an exemplary embodiment of the present technology.
Figure 3:
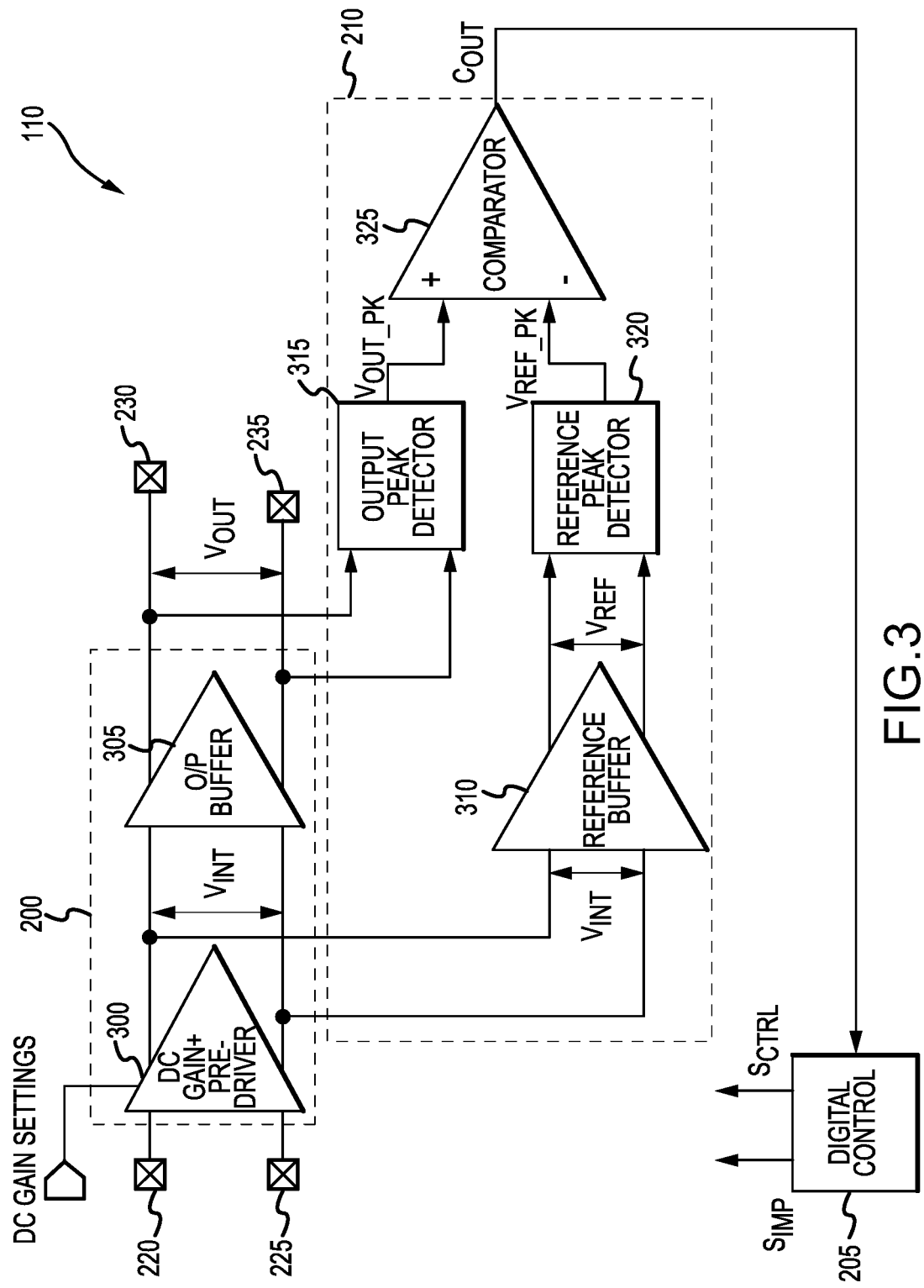
FIG. 3 is a simplified circuit diagram of an interface in accordance with an exemplary embodiment of the present technology.
Figure 4:
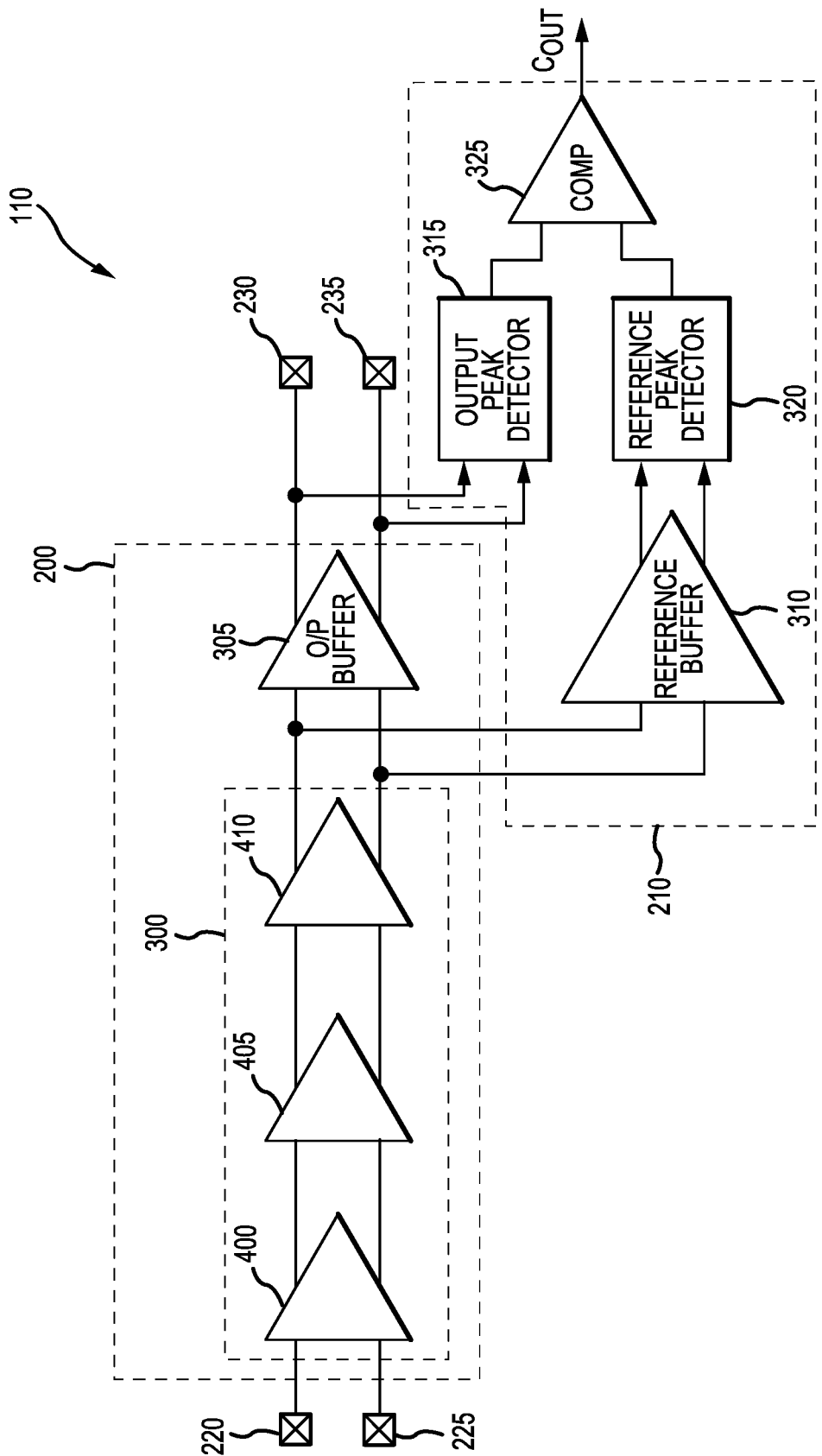
FIG. 4 is a circuit diagram of the interface in accordance with an exemplary embodiment of the present technology.

Referring to FIGS. 1-3, the interface circuit 110 may provide high-speed communication (data transmission) at a various voltages, such as at high and low voltages, across a channel. In one embodiment, the interface circuit 110 may be configured to perform at 1.8 volts for data rates of 5 Gbps (gigabits per second), 8.1 Gbps, and 10 Gbps. In other embodiments, the interface circuit 110 may be configured to perform at any desired supply voltage level and any data rate. In addition, the interface circuit 110 may be capable of operating according to USB 3.1 SuperSpeed Plus protocol, for example completing related transmission and reception compliance testing at 10 Gbps. In one embodiment, the interface circuit 110 may be implemented as a redriver for multi-protocol applications, such as USB and/or DisplayPort.

The interface circuit 110 may be configured to regenerate signals to boost the quality of an input signal $V_{IN}$ transmitted from the host device 105 to the sink device 115. The interface circuit 110 may also be configured to adjust and correct for known channel losses and restore signal integrity.

According to various embodiments, the interface circuit 110 may selectively bias various terminals to achieve a desired operation and/or improve interoperability between the host device 105 and the interface circuit 110. In addition, the interface circuit 110 may operate according to various modes, such as a high-speed mode (i.e., an active mode) and a power-saving mode (i.e., a slumber mode, a low power mode), such as at approximately 1.8 volts.

According to an exemplary embodiment, the interface circuit 110 may be configured to receive or generate a supply voltage $V_{CC}$. For example, the supply voltage $V_{CC}$ may be generated using any suitable circuit and/or system and may be generated on the same chip as the interface circuit 110 or a companion chip.

In various embodiments, the interface circuit 110 may be configured as a uni-directional channel or a bi-directional channel. For example, the interface circuit 110 may transmit data in one direction (e.g., from the host device 105 to the sink device 115) or may transmit data in both directions (e.g., from the host device 105 to the sink device 115 and from the sink device 115 to the host device 105). In various embodiments, the channel may comprise a communication device, such as a receiver 200, a transmitter (not shown), a transceiver (not shown), or the like, connected between an input terminal and an output terminal of the channel. The channel may have any desired architecture, such as a differential architecture or a single-ended architecture.

In an exemplary embodiment, the input terminal of the channel may comprise a pair of input pads, such as a first input pad 220 and a second input pad 225. In addition, the output terminal of the channel may comprise a pair of output pads, such as such as a third output pad 230 and a fourth output pad 235. The pair of input pads may be used to connect the host device 105 to the interface circuit 110, and the pair of output pads may be used to connect the interface circuit 110 to the sink device 115. For example, the pair of input pads 220, 225 may be connected to the first and second transmission lines 120, 125, respectively, and the pair of output pads 230, 235 may be connected to the third and fourth transmission lines 130, 135, respectively.

The interface circuit 110 may be further configured to selectively bias the channel and/or the pair of input pads 220, 225 with a particular voltage and/or provide a variable impedance at the input terminal. According to an exemplary embodiment, the interface circuit 110 may comprise a switching circuit 215 comprising a plurality of switching devices, such as a first switching device 240 and a second switching device 245, connected to a first termination resistor 260 and a second termination resistor 265, respectively. The first and second termination resistors 260, 265 and the switching circuit 215 may be connected between the supply voltage $V_{CC}$ and the channel.

The first termination resistor 260 and the second termination resistor 265 may comprise any suitable resistive element for reducing current and/or voltage and may comprise passive components and/or active components. Each termination resistor 260, 265 may have a resistance value in the range of 40 to 60 ohms. In an exemplary embodiment, the resistance value may be 50 ohms.

According to various embodiments, each switching device 240, 245 may comprise any device and/or circuit suitable for controlling current flow, such as a bipolar junction transistor, a metal-oxide-semiconductor transistor, and the like.

According to various embodiments, the receiver 200 may be configured to amplify, compensate for channel loss, and/or apply a desired gain to an input signal, such as the input signal $V_{IN}$ from the host device 105. According to an exemplary embodiment, input terminals of the receiver 200 may be connected to the pair of input pads 220, 225 and the output terminals of the receiver 200 may be connected to the pair of output pads 230, 235.

The receiver 200 may comprise any circuit and/or system suitable for providing a desired signal transmission and/or operating specifications. For example, the receiver 200 may comprise an input circuit 300 and an output circuit 305 that operate in conjunction with each other to adjust the gain of the input signal, equalize the input signal, and drive the input signal.

According to an exemplary embodiment, the input circuit 300 may be configured to perform gain functions and equalize the input signal $V_{IN}$. For example, the input circuit may comprise a gain circuit 400, an equalizer circuit 405, and a pre-driver circuit 410 connected in series with each other. In one embodiment, the equalizer circuit 405 may be followed by the gain circuit 400, and the pre-driver circuit 410 may be followed by the equalizer circuit 405. Accordingly, the gain circuit 400 may be directly connected to the pair of input pads 220, 255 and the pre-driver circuit 410 may be directly connected to the output circuit 305. A voltage potential at the output terminals of the input circuit 300 (in particular, the output terminals of the pre-driver circuit 410) may be referred to as an intermediate voltage $V_{INT}$.

In one embodiment, the gain circuit 400 may comprise an amplifier with an adjustable gain, the equalizer circuit 405 may comprise a continuous time linear equalizer, and the pre-driver circuit 410 may comprise a second equalizer.

The output circuit 305 may be configured to provide a final power amplification stage to drive the load (e.g., the sink device 115). For example, the output circuit 305 may comprise an output buffer amplifier. According to an exemplary embodiment, an input terminal of the output circuit 305 may be directly connected to an output terminal of the input circuit 300. For example, the output terminal of the input circuit 300 may be connected to an output terminal of the pre-driver circuit 410. Accordingly, the output circuit 305 may receive the intermediate voltage $V_{INT}$ at its input terminals. In addition, an output terminal of the output circuit 305 may be directly connected to the pair of output pads 230, 235. A voltage potential at the output terminals of the output circuit 305 may be referred to as an output voltage $V_{OUT}$.

According to various embodiments, the interface circuit 110 may be configured to distinguish or otherwise detect a hot unplug condition. The hot unplug condition may be defined as removing a load (such as the sink device 115) from a terminal, such as the output terminal, of the interface circuit 110. In an exemplary embodiment, the interface circuit 110 may further comprise a detection circuit 210 and a control circuit 205 that operate in conjunction with each other to detect a hot unplug condition and power-down the interface circuit 110 in response to a detected hot unplug condition.

According to an exemplary embodiment, the detection circuit 210 may be configured to monitor or otherwise detect signals within the interface circuit 110. The detection circuit 210 may be connected to various nodes and/or terminals of the receiver 200. For example, the detection circuit 210 may be directly connected to the output terminals of the input circuit 300, and in particular, the output terminals of the pre-driver circuit 410. In addition, the detection circuit 210 may be directly connected to the output terminals of the output circuit 305.

According to an exemplary embodiment, the detection circuit 210 may comprise a reference buffer 310, a first magnitude detector 315 (i.e., a first magnitude detection circuit), a second magnitude detector 320 (i.e., a second magnitude detection circuit), and a comparator 325.

The reference buffer 310 may be configured to perform substantially the same function as the output circuit 305. For example, the reference buffer 310 and the output circuit 305 may be identical in topology, but the reference buffer 310 may operate at a lower power than the output circuit 305. For example, the reference buffer 310 may comprise a buffer amplifier circuit.

In an exemplary embodiment, the reference buffer 310 may be directly connected to the output terminal of the input circuit 300, and in particular, the output terminal of the pre-driver circuit 410. Accordingly, the reference buffer 310 may receive the intermediate voltage $V_{INT}$ at its input terminals and generate a reference voltage $V_{REF}$ according to the intermediate voltage. In an exemplary embodiment, the reference voltage is proportional to the intermediate voltage $V_{INT}$.

The first magnitude detector 315 may be configured to compute or otherwise detect a magnitude of the output voltage $V_{OUT}$. For example, an input terminal of the first magnitude detector 315 may be connected to the output terminals of the output circuit 305 and receive the output voltage $V_{OUT}$. In an exemplary embodiment, the first magnitude detector 315 may comprise a peak detector configured to detect a peak voltage in the output voltage $V_{OUT}$ and generate a first peak voltage $V_{OUT\_PK}$ according to the output voltage $V_{OUT}$. In other embodiments, the first magnitude detector 315 may comprise any circuit and/or system suitable for measuring a magnitude of a signal.

Similarly, the second magnitude detector 320 may be configured to compute or otherwise detect a magnitude of the reference voltage $V_{REF}$. For example, an input terminal of the second magnitude detector 320 may be connected to the output terminals of the reference buffer 310 and receive the reference voltage $V_{REF}$. In an exemplary embodiment, the second magnitude detector 320 may comprise a peak detector configured to detect a peak voltage in the reference voltage $V_{REF}$ and generate a second peak voltage $V_{REF\_PK}$ according to the reference voltage $V_{REF}$. In other embodiments, the second magnitude detector 320 may comprise any circuit and/or system suitable for measuring a magnitude of a signal.

The comparator 325 may be configured to compare two signals and generate a comparator output signal $C_{OUT}$ based on the comparison. In an exemplary embodiment, the comparator 325 may comprise a first input terminal (a positive terminal) to receive the first peak voltage $V_{OUT\_PK}$ and a second input terminal (a negative terminal) to receive the second peak voltage $V_{REF\_PK}$. Accordingly, the comparator output signal $C_{OUT}$ may be based on a comparison of the first peak voltage $V_{OUT\_PK}$ to the second peak voltage $V_{REF\_PK}$. For example, the comparator output signal $C_{OUT}$ may be HIGH (e.g., logic "1" or voltage greater than 0) if the first peak voltage $V_{OUT\_PK}$ is greater than the second peak voltage $V_{REF\_PK}$. Alternatively, the comparator output signal $C_{OUT}$ may be LOW (e.g., logic "0" or 0 volts) if the first peak voltage $V_{OUT\_PK}$ is less than the second peak voltage $V_{REF\_PK}$. The value of the comparator output signal COUT may indicate the hot unplug condition. For example, a HIGH comparator output value may indicate the hot unplug condition, since a hot unplug condition will result in voltage swings at the output terminal of the output circuit 305. The comparator 325 may comprise a conventional comparator or any other circuit suitable for generating an output indicating a relationship between two signals.

The interface circuit 110 may further comprise a control circuit 205 responsive to the detection circuit 210 and configured to generate various control signals according to the comparator output signal $C_{OUT}$. For example, the control circuit 205 may generate an impedance signal $S_{IMP}$ according to the comparator output signal $C_{OUT}$ and transmit the impedance signal $S_{IMP}$ to the switching circuit 215 to control the impedance and/or biasing of the channel. In addition, the control circuit 205 may generate a control signal $S_{CTRL}$ and transmit the control signal $S_{CTRL}$ to the receiver 200 to power-down the receiver 200. According to an exemplary embodiment, the control circuit 205 may be configured as a digital circuit and may comprise a microcontroller or any circuit and/or system suitable for generating signals according to an input signal.

In operation, the interface circuit 110 may immediately detect a hot unplug condition (e.g., when a physical disconnection between the interface circuit 110 and the sink device 115 occurs). For example, the detection circuit 210 may detect the hot unplug condition within a time period defined by a real number greater than 1 with a factor in the range of $10^{-15}$ to $10^{-9}$ (i.e., within a range of 1 femtosecond to 1 nanosecond). In an exemplary embodiment, the detection circuit 210 may detect the hot unplug condition within a range of 150 to 200 nanoseconds, such as 176 nanoseconds. In addition, the interface circuit 110 may power-down the receiver 200 when the hot unplug condition is detected.

Referring to FIGS. 1-8, an exemplary operation may comprise detecting a hot unplug condition even if the interface circuit 110 is in an active mode and powering-down the interface circuit 110 in the event a hot unplug condition is detected. For example, and referring to FIG. 6, at start-up, the interface circuit 110 may be in an "unplug mode" (i.e., low-power mode) and will poll for a load at a predetermined interval (e.g., every 12 milliseconds). After the load is detected, the interface circuit 110 enters the "active mode" (i.e., high-power mode) and at any time during the active mode, the interface circuit 110 may detect that the load has been unplugged (disconnected) from the interface circuit 110 using the detection circuit 210.

In various embodiments, a hot unplug condition may be detected based on the peak of the output voltage $V_{OUT}$. For example, when a hot unplug condition occurs, the peak of output voltage $V_{OUT}$ swings. The amount of swing may vary based on the particular interface, the supply voltage, and other parameters. Therefore, the detection circuit 210 may generate a dynamic reference voltage $V_{REF}$ that varies to accommodate various protocols, supply voltages, output swings, and the like. The detection circuit 210 may detect the swing by comparing the peak of the output voltage $V_{OUT}$ to the reference voltage $V_{REF}$.

In an exemplary operation may comprise generating the intermediate voltage $V_{INT}$, for example with the input circuit 300, generating the output voltage $V_{OUT}$ with the output circuit 305 according to the intermediate voltage $V_{INT}$, and generating the reference voltage $V_{REF}$ with the reference buffer 310 according to the intermediate voltage $V_{INT}$.

The operation may further comprise detecting a peak amplitude of the output voltage $V_{OUT}$ (i.e., $V_{OUT\_PK}$), for example with the first peak detector 315, and detecting a peak amplitude of the reference voltage $V_{REF}$ (i.e., $V_{REF\_PK}$), for example with the second peak detector 320.

The operation may further comprise comparing the peak amplitude of the output voltage $V_{OUT}$ (i.e., $V_{OUT\_PK}$) with the peak amplitude of the reference voltage $V_{REF}$ (i.e., $V_{REF\_PK}$). For example, the interface circuit 110 may utilize the comparator 325 to compare the peak values ($V_{OUT\_PK}$ and $V_{REF\_PK}$) and generate the comparator output signal $C_{OUT}$ according to the comparison. In an exemplary operation, the comparator output signal $C_{OUT}$ may indicate the hot unplug condition. The comparator 325 may then transmit the comparator output signal $C_{OUT}$ to the control circuit 205, wherein the control circuit 205 may generate the control signal $S_{CTRL}$ to power-down the receiver 200 and/or generate the impedance signal $S_{IMP}$ to control biasing of the channel.

Figure 5:
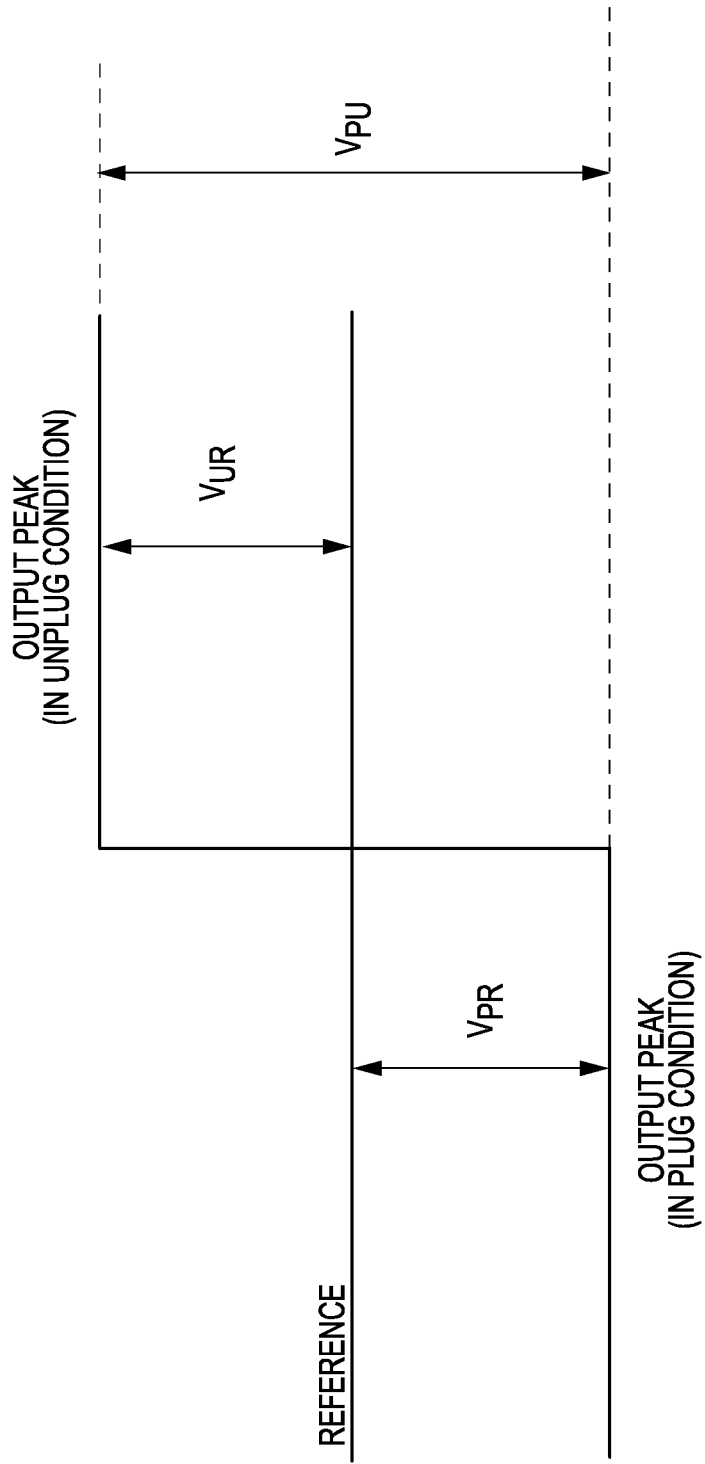
FIG. 5 illustrates peak voltages in a plug condition and an unplug condition relative to a reference voltage.
Figure 6:
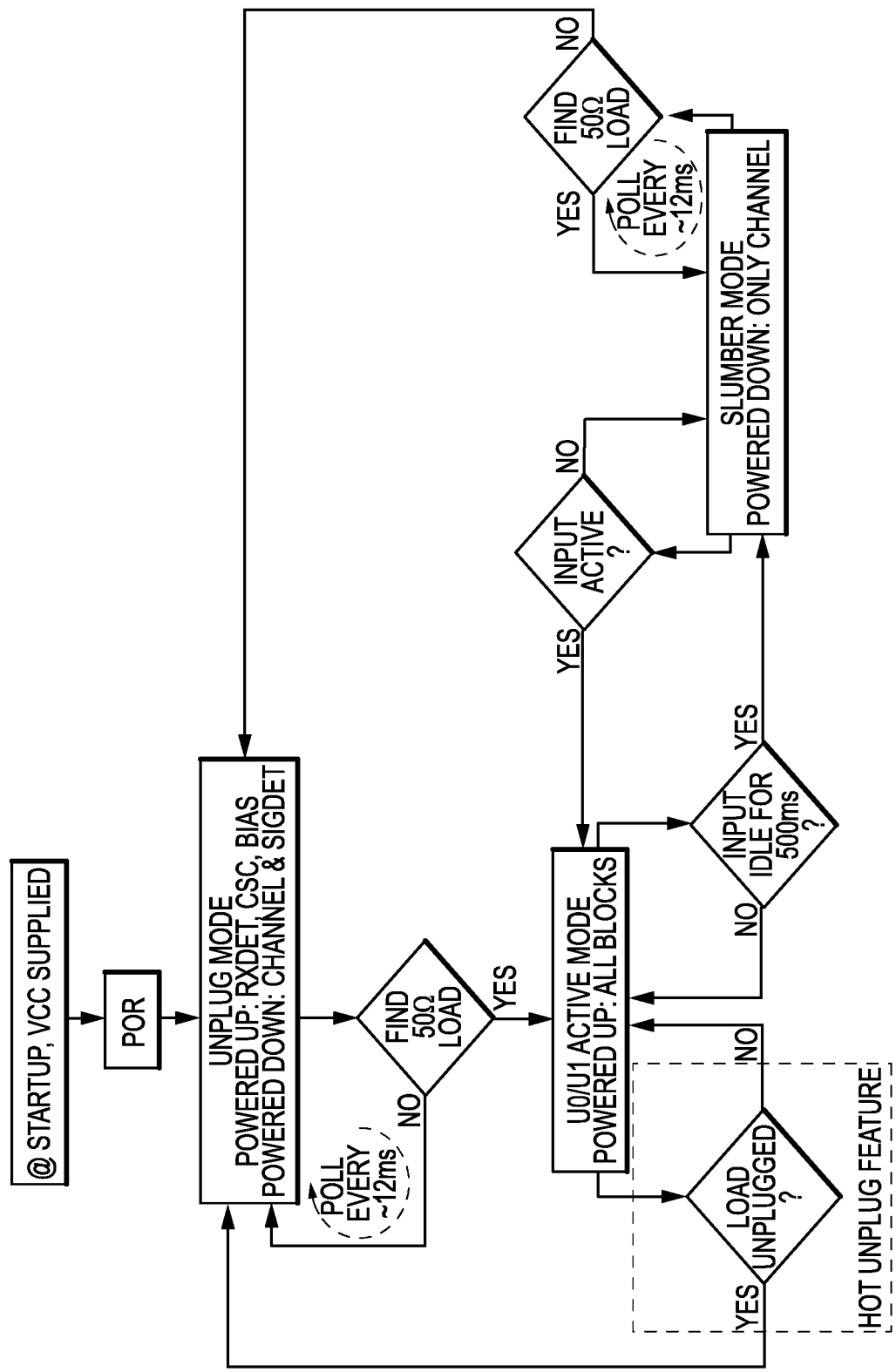
FIG. 6 is a flow chart for detecting an unplug condition and powering down the interface in accordance with an exemplary embodiment of the present technology.
Figure 7:
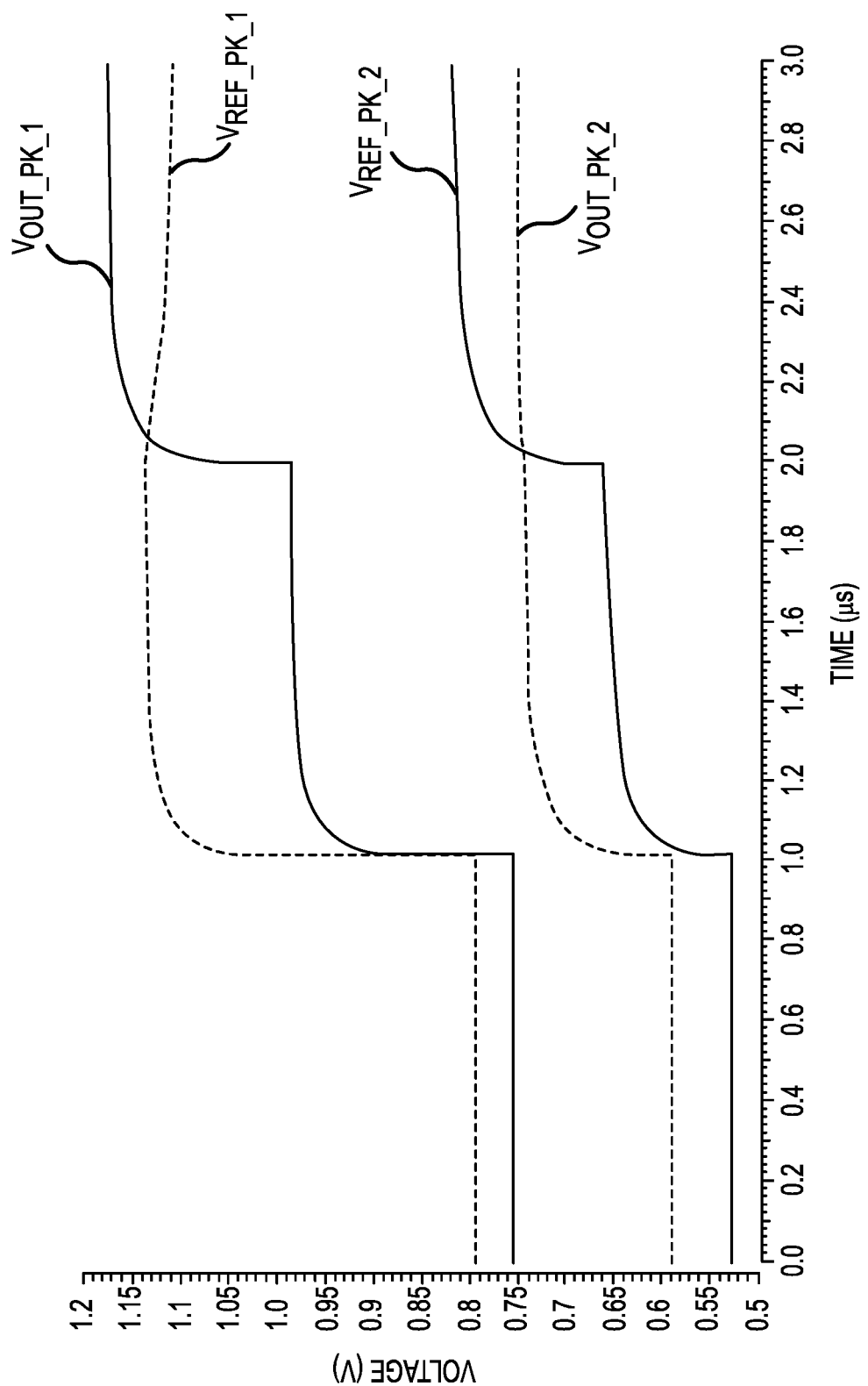
FIG. 7 illustrates a transient analysis for the interface circuit in a first operation and a second operation in accordance with an exemplary embodiment of the present technology.
Figure 8:
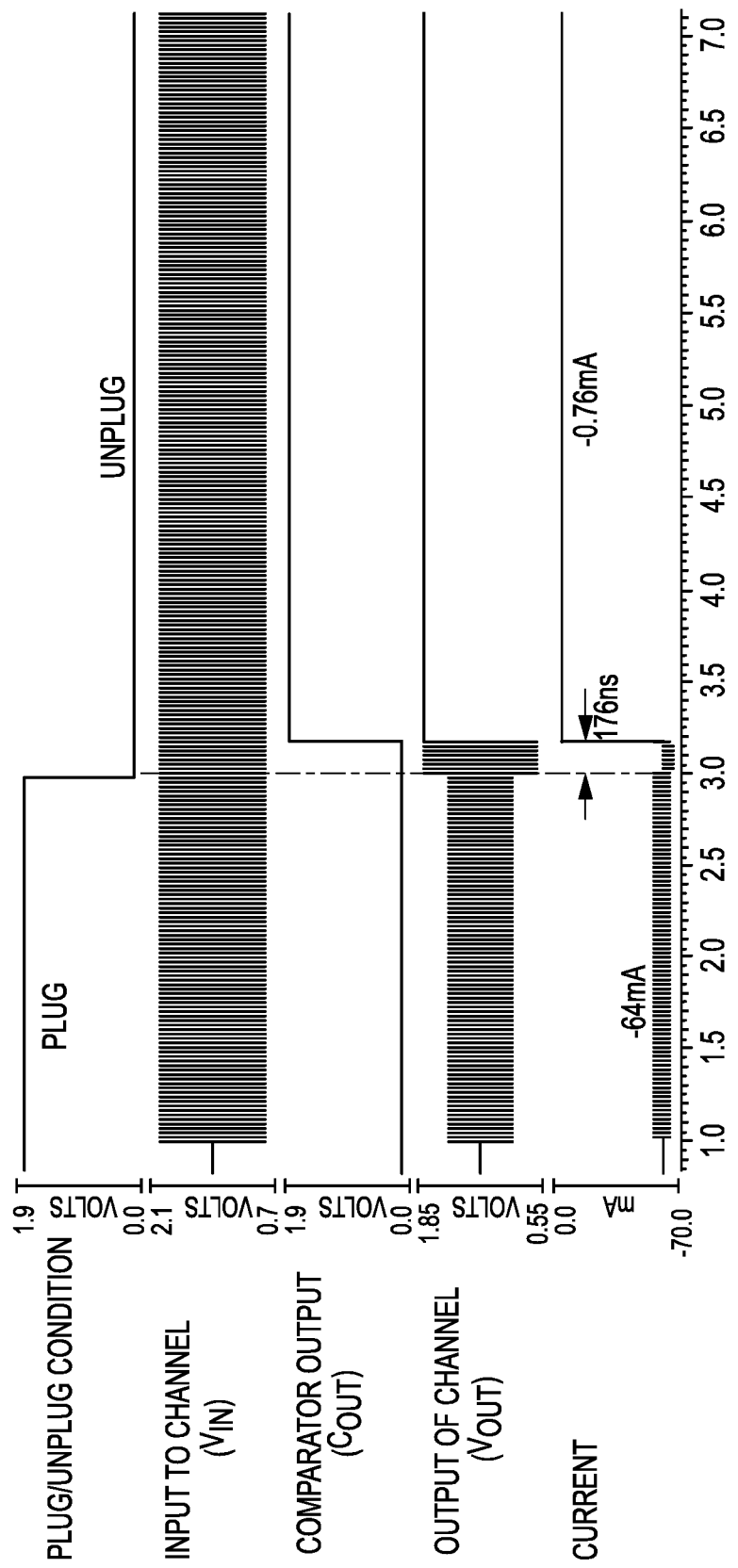
FIG. 8 illustrates various signals in the interface during the plug and unplug conditions in accordance with an exemplary embodiment of the present technology.
Figure 9:
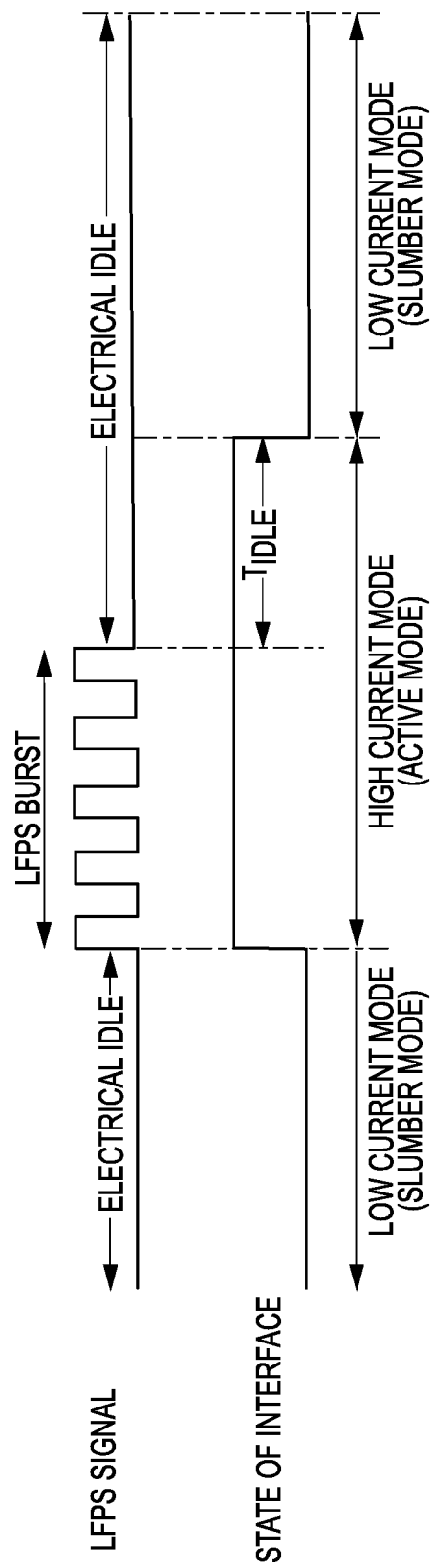
FIG. 9 illustrates various states of the interface for power optimization.

In various operations, and referring to FIGS. 5 and 7, since the reference voltage $V_{REF}$ is generated according to the intermediate voltage $V_{INT}$, the reference voltage $V_{REF}$ is proportional to the reference voltage $V_{INT}$ and maintains a substantially flat transient response that is between a peak in the output voltage $V_{OUT}$ in a plug condition and a peak in the output voltage $V_{OUT}$ in the unplug condition for all parameters (i.e., input swings, supply voltages, gains, and the like). For example, and referring to FIG. 7, the transient analysis for the interface circuit 110 illustrates the dynamic reference voltage $V_{REF}$ in two cases and how the unplug condition can be detected under two different operating conditions. In each case, the peak values of the reference voltage $V_{REF}$ are between the peak value of the output voltage during the plug condition and the peak value of the output voltage during the unplug condition.

In a first operating condition, the peak values of the output voltage of the interface circuit 110 form a first waveform $V_{OUT\_PK\_1}$ and the peak values of the reference voltage that are generated under the same operating conditions forms a second waveform $V_{REF\_PK\_1}$. In a second operating condition, the peak values of the output voltage of the interface circuit 110 form a third waveform $V_{OUT\_PK\_2}$ and the peak values of the reference voltage that are generated under the same operating conditions forms a fourth waveform $V_{REF\_PK\_2}$. Therefore, when a hot unplug condition occurs and the output voltage $V_{OUT}$ swings, the voltage differences in the plug and unplug conditions are compared to the peak values of the reference voltage $V_{REF}$ and the voltage swing at the output of the output circuit 305 may be detected. For example, and referring to FIG. 5, when the peaks of the reference voltage VREF are between the peak of the output voltage in the plug condition and the peak of the output voltage in the unplug condition, the detection circuit 210 is able to detect $V_{PU}$, $V_{UR}$, and $V_{PR}$, where $V_{PU}$ is a voltage difference in the output voltage peaks in the plug and unplug conditions, $V_{UR}$ is a voltage difference between a peak in the output voltage $V_{OUT}$ in the unplug condition and a peak in the reference voltage $V_{REF}$, and $V_{PR}$ is a voltage difference between a peak in the output voltage $V_{OUT}$ in the plug condition and a peak in the reference voltage $V_{REF}$.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An interface circuit, comprising:
   a communication device, comprising: an input circuit connected in series with an output circuit; and
   a detection circuit comprising:
      a reference buffer comprising an input terminal connected to an output terminal of the input circuit having a first output voltage; and
      a magnitude detection circuit comprising:

a first input terminal connected to an output terminal of the output circuit having a second output voltage; and a second input terminal connected to an output terminal of the reference buffer;

wherein the magnitude detection circuit generates a first peak voltage according to the first output voltage and a second peak voltage according to the second output voltage; and a comparator connected to an output terminal of the magnitude detection circuit and configured to generate an output signal based on the first peak voltage and the second peak voltage, wherein the output signal indicates a hot unplug condition.

2. The interface circuit according to claim 1, wherein the detection circuit detects the hot unplug condition within a time period defined by a real number greater than 1 with a factor in the range of $10^{-15}$ to $10^{-9}$.

3. The interface circuit according to claim 1, wherein:
the input circuit comprises a pre-driver circuit configured to modify a differential input signal at an input terminal of the interface circuit; and
the output circuit comprises a buffer amplifier configured to transfer the second output voltage to a sink device.

4. The interface circuit according to claim 1, wherein the magnitude detection circuit comprises a first magnitude detection circuit comprising the second input terminal connected the output terminal of the reference buffer and configured to generate the first peak voltage.

5. The interface circuit according to claim 4, wherein the magnitude detection circuit further comprises a second magnitude detection circuit comprising the first input terminal connected to the output terminal of the output circuit and configured to generate the second peak voltage.

6. The interface circuit according to claim 5, wherein the comparator is connected to an output terminal of the first magnitude detection circuit and an output terminal of the second magnitude detection circuit, wherein the comparator is configured to compare the first peak voltage with the second peak voltage.

7. The interface circuit according to claim 1, further comprising a control circuit connected to the detection circuit and responsive to the output signal of the detection circuit, wherein the control circuit is configured to power-down the communication device according to the output signal.

8. A method for detecting a hot unplug condition, comprising:
generating a first output voltage with a buffer amplifier according to a second output voltage of a pre-driver;
generating a reference voltage with a reference buffer according to the second output voltage of the pre-driver, wherein:
the reference buffer is connected in parallel with the buffer amplifier; and
the pre-driver is connected in series with both the reference buffer and the buffer amplifier;
detecting a peak amplitude of the first output voltage;
detecting a peak amplitude of the reference voltage;
comparing the peak amplitude of the first output voltage with the peak amplitude of the reference voltage; and
generating an output signal according to the comparison, wherein the output signal indicates the hot unplug condition.

9. The method according to claim 8, wherein the output signal comprises:

a first value if the peak amplitude of the reference voltage is greater than the peak amplitude of the first output voltage; and
a second value if the peak amplitude of the reference voltage is less than the peak amplitude of the first output voltage.

10. The method according to claim 9, wherein the second value corresponds to the hot unplug condition.

11. The method according to claim 8, further comprising generating a power-down signal based on the output signal.

12. The method according to claim 8, further comprising generating an impedance control signal based on the output signal.

13. The method according to claim 8, wherein the detecting the hot unplug condition occurs within a time period defined by a real number greater than 1 with a factor in the range of $10^{-15}$ to $10^{-9}$.

14. A system, comprising:
a host device connected to a sink device via an interface circuit, wherein the interface circuit comprises:
a communication device, comprising an input circuit connected in series with a output circuit, wherein:
the input circuit generates an intermediate voltage; and
the output circuit generates an output voltage according to the intermediate voltage; and
a detection circuit configured to detect a hot unplug condition, and comprising:
a reference buffer connected in parallel with the output circuit and in series with the input circuit, wherein the reference buffer generates a reference voltage according to the intermediate voltage;
a first peak detector connected to an output terminal of the output circuit and configured to generate a first peak signal according to the output voltage;
a second peak detector connected to an output terminal of the reference buffer and configured to generate a second peak signal according to the reference voltage; and
a comparator, connected to the first peak detector and the second peak detector, configured to generate an output signal according to the first peak signal and the second peak signal, wherein the output signal indicates the hot unplug condition.

15. The system according to claim 14, wherein the interface circuit further comprises a control circuit connected to an output terminal of the comparator and configured to generate a control signal to power-down the communication device.

16. The system according to claim 14, wherein the detection circuit detects the hot unplug condition within a time period defined by a real number greater than 1 with a factor in the range of $10^{-15}$ to $10^{-9}$.

17. The system according to claim 14, wherein the output signal comprises:
a first value if the peak amplitude of the reference voltage is greater than the peak amplitude of the first output voltage; and
a second value if the peak amplitude of the reference voltage is less than the peak amplitude of the first output voltage.

18. The system according to claim 17, wherein the second value corresponds to the hot unplug condition.

19. The system according to claim 14, wherein the reference voltage is proportional to the intermediate voltage.

* * * * *